(12) United States Patent
McKee et al.

(10) Patent No.: US 7,800,146 B2
(45) Date of Patent: Sep. 21, 2010

(54) IMPLANTED ISOLATION REGION FOR IMAGER PIXELS

(75) Inventors: Jeffrey A. McKee, Meridian, ID (US); Richard A. Mauritzson, Meridian, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 362 days.

(21) Appl. No.: 11/211,651

(22) Filed: Aug. 26, 2005

(65) Prior Publication Data

US 2007/0045679 A1    Mar. 1, 2007

(51) Int. Cl.
*H01L 31/062* (2006.01)
(52) U.S. Cl. .................. 257/292; 257/291; 257/446; 257/E27.13; 257/E27.131; 257/E27.133
(58) Field of Classification Search ......... 257/291–293, 257/446, E27.13, E27.131, E27.133
See application file for complete search history.

(56) References Cited

U.S. PATENT DOCUMENTS

| | | | |
|---|---|---|---|
| 5,955,753 A | 9/1999 | Takahashi | |
| 6,107,655 A | 8/2000 | Guidash | |
| 6,160,281 A | 12/2000 | Guidash | |
| 6,177,333 B1 | 1/2001 | Rhodes | |
| 6,218,656 B1 | 4/2001 | Guidash | |
| 6,344,666 B1 | 2/2002 | Yamaguchi et al. | |
| 6,352,869 B1 | 3/2002 | Guidash | |
| 6,423,993 B1 * | 7/2002 | Suzuki et al. | 257/292 |
| 6,423,994 B1 | 7/2002 | Guidash | |
| 6,552,323 B2 | 4/2003 | Guidash et al. | |
| 6,657,665 B1 | 12/2003 | Guidash | |
| 6,661,045 B2 | 12/2003 | Ishiwata | |
| 6,690,423 B1 | 2/2004 | Nakamura et al. | |
| 6,809,008 B1 | 10/2004 | Holm et al. | |
| 6,815,743 B2 | 11/2004 | Rhodes | |
| 6,856,001 B2 | 2/2005 | Rhodes | |
| 6,947,088 B2 | 9/2005 | Kochi | |
| 2004/0094784 A1 | 5/2004 | Rhodes et al. | |
| 2004/0227206 A1 | 11/2004 | Oyamatsu | |
| 2004/0253761 A1 | 12/2004 | Rhodes et al. | |
| 2005/0023635 A1 | 2/2005 | Mouli et al. | |
| 2005/0040445 A1 | 2/2005 | Mouli | |
| 2005/0062084 A1 | 3/2005 | Han | |

(Continued)

FOREIGN PATENT DOCUMENTS

EP    0 501 316 A2    9/1992

(Continued)

OTHER PUBLICATIONS

Toshiba $C^2$ MOS Digital Integrated Circuit Silicon Monolithic, ver. 2.07, Jun. 10, 2003.

(Continued)

*Primary Examiner*—Matthew E Warren
(74) *Attorney, Agent, or Firm*—Dickstein Shapiro LLP

(57) ABSTRACT

A pixel cell array architecture having ion implant regions as isolation regions between adjacent active areas of pixels in the array. In one exemplary embodiment, the invention provides an ion-doped p-well region separating n-type photosensitive areas of neighboring pixel cells. The pixel cells have increased fill factor without encountering the disadvantages associated with conventional shallow trench isolation regions.

34 Claims, 8 Drawing Sheets

U.S. PATENT DOCUMENTS

| | | | |
|---|---|---|---|
| 2005/0087781 A1 | 4/2005 | Kuwazawa et al. | |
| 2005/0167574 A1 | 8/2005 | He et al. | |
| 2005/0176167 A1 | 8/2005 | Lee | |
| 2006/0186505 A1* | 8/2006 | Adkisson et al. | 257/463 |
| 2007/0158713 A1* | 7/2007 | Ohkawa | 257/292 |

FOREIGN PATENT DOCUMENTS

| | | |
|---|---|---|
| EP | 1 427 023 A2 | 6/2004 |
| JP | 11-274461 | 8/1999 |
| KR | 2002-0058492 A | 7/2002 |
| TW | 578303 | 3/2004 |

OTHER PUBLICATIONS

Toshiba Extends CMOS Image Sensor Camera Module Lineup Camera, One of World'S Smallest, http://www.toshiba.com/taec/press/to-392.shtml, Mar. 2, 2005.

Toshiba CMOS Digital Integrated Circuit Silicon Monolithic, ver. 1.20, Jan. 5, 2004.

CMOS Image Sensor, http://www.toshiba.com/taec/cqi-bin/display.cgi, Mar. 2, 2005.

New Toshiba CMOS Image Sensor Camera Enables Wireless High-Quality Photos for Next-Generation Phones . . . , http://www.toshiba.com/taec/press/to-335.shtml, Mar. 2, 2005.

* cited by examiner

US 7,800,146 B2

IMPLANTED ISOLATION REGION FOR IMAGER PIXELS

FIELD OF THE INVENTION

The present invention relates generally to digital image sensors and in particular to isolating pixel cells in an imager array.

BACKGROUND OF THE INVENTION

Typically, a digital imager array includes a focal plane array of pixel cells, each one of the cells including a photosensor, e.g. a photogate, photoconductor, or a photodiode. In a CMOS imager a readout circuit is connected to each pixel cell which typically includes a source follower output transistor. The photosensor converts photons to electrons which are typically transferred to a storage region, e.g., a floating diffusion region, which is connected to the gate of the source follower output transistor. A charge transfer device (e.g., transistor) can be included for transferring charge from the photosensor to the floating diffusion region. In addition, such imager cells typically have a transistor for resetting the floating diffusion region to a predetermined charge level prior to charge transference. The output of the source follower transistor is gated as a pixel output signal by a row select transistor.

Exemplary CMOS imaging circuits, processing steps thereof, and detailed descriptions of the functions of various CMOS elements of an imaging circuit are described, for example, in U.S. Pat. No. 6,140,630, U.S. Pat. No. 6,376,868, U.S. Pat. No. 6,310,366, U.S. Pat. No. 6,326,652, U.S. Pat. No. 6,204,524, and U.S. Pat. No. 6,333,205, each assigned to Micron Technology, Inc. The disclosures of each of the forgoing patents are hereby incorporated by reference in their entirety.

With reference to FIGS. 1 and 2, which respectively illustrate a top-down and a cross-sectional view of a conventional CMOS pixel sensor cell 100, when incident light 187 strikes the surface of a photodiode photosensor 120, electron/hole pairs are generated in the silicon. The generated electrons (photo-charges) are collected in the n-type accumulation region 122 just below the p+ surface layer 123 of the photodiode photosensor 120. The photo-charges move from the initial charge accumulation region 122 to a floating diffusion region 110 via a transfer transistor 106. The charge at the floating diffusion region 110 is typically converted to a pixel output voltage by a source follower transistor 108 and subsequently output on a column output line 111 via a row select transistor 109.

Conventional CMOS images, such as that shown in FIG. 1, typically achieve approximately a fifty percent fill factor or less, meaning that less than half of the pixel 100 is utilized as the photosensor for converting light to charge carriers. As shown in FIG. 1, only a small portion of the cell 100 comprises a photosensitive element (i.e., photosensor 120). The remainder of the pixel cell 100 includes isolation regions 102 (FIG. 2), shown as shallow trench isolation (STI) or local oxidation on silicon (LOCOS) regions in a substrate 101, the floating diffusion region 110 coupled to a transfer gate 106' of the transfer transistor 106, and source/drain regions 115 for reset 107, source follower 108, and row select 109 transistors having respective gates 107', 108', and 109'. Moreover, as the total pixel area continues to decrease (due to desired scaling), it becomes increasingly important to create high sensitivity photosensors that utilize a minimum amount of surface area and/or to develop more efficient layouts of the pixel array for the non-photosensitive components of the cells to provide an increased size for the photosensitive areas.

As briefly mentioned above, shallow trench isolation (STI) is one technique that can be used to isolate pixels from one another in a pixel array, or other integrated structures from one another. As depicted in FIG. 2, an STI region 102 is typically formed as an isolation trench 117 formed in the substrate 101 to isolate the active areas of one pixel from other pixel cells. In a typical STI isolation structure 102, a trench 117 is etched into the substrate 101 and filled with one or more layers of dielectric material 125 to provide a physical and electrical barrier between adjacent active areas within a substrate. For example, an STI structure 102 can be formed by etching a trench 117 and then filling it with a dielectric 125 such as a chemical vapor deposited (CVD) or high density plasma (HDP) silicon oxide or silicon dioxide ($SiO_2$). The filled trench is then planarized by a chemical mechanical planarization (CMP) or etch-back process so that the dielectric 125 remains only in the trench 117 and its top surface remains level with that of the silicon substrate 101. To enhance the isolation further, ions may be implanted into the silicon substrate 101 in the area 140 directly beneath the trench 117.

Further, although deeper STI regions 102 may provide better isolation, there is a limit as to how deep the STI region 102 can be made. If the STI region 102 is too deep, filling the trench 117 with oxide layers 125 may produce voids or cracks 116 in the filled trench 117. In addition, creating an isolation trench 117 that is too wide takes away area of the pixel cell 100 that could otherwise be photosensitive, thereby decreasing the pixel's 100 fill factor.

A pixel array having sufficient pixel isolation and having an increased fill factor is therefore desired.

BRIEF SUMMARY OF THE INVENTION

The present invention, in the various exemplary embodiments, provides a pixel cell array architecture having ion implant regions as isolation regions between adjacent active areas of pixels in the array. For example, in one exemplary embodiment, the invention provides an ion-doped well region separating photosensors of neighboring pixels. The use of implant isolation regions decreases the necessary spacing between the photosensors, providing increased fill factor for pixels without encountering some of the disadvantages associated with conventional shallow trench isolation regions.

In accordance with exemplary embodiments of the invention, to further improve the photosensor fill factor, the neighboring pixel cells may share pixel components, including parts operative for reading out signals from the pixels. In addition, angled transfer gates may also be used.

BRIEF DESCRIPTION OF THE DRAWINGS

Additional advantages and features of the present invention will be apparent from the following detailed description and drawings which illustrate preferred embodiments of the invention, in which.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "wafer" and "substrate," as used herein, are to be understood as including silicon, epitaxial silicon, silicon-on-insulator (SOI) or silicon-on-sapphire (SOS) technology, doped and undoped semiconductors, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photosensor and associated transistors for converting photons to an electrical signal. For purposes of illustration, representative pixels are illustrated in the figures and their formation is described herein; however, typically fabrication of a plurality of like pixels proceeds simultaneously. Accordingly, the following detailed description is not to be taken in a limiting sense, and the scope of the present invention is defined only by the appended claims.

The terms "at an angle," "angled," and "slanted," as used herein are to be interpreted as meaning at any angle, with respect to some stated reference point, that is not exactly parallel or exactly perpendicular. Accordingly, when a part of an object and some reference point meet to form an angle that is not 0°, 90°, or 180°, the object is considered "angled," "at an angle," or "slanted" with respect to the reference point.

Figure 3:
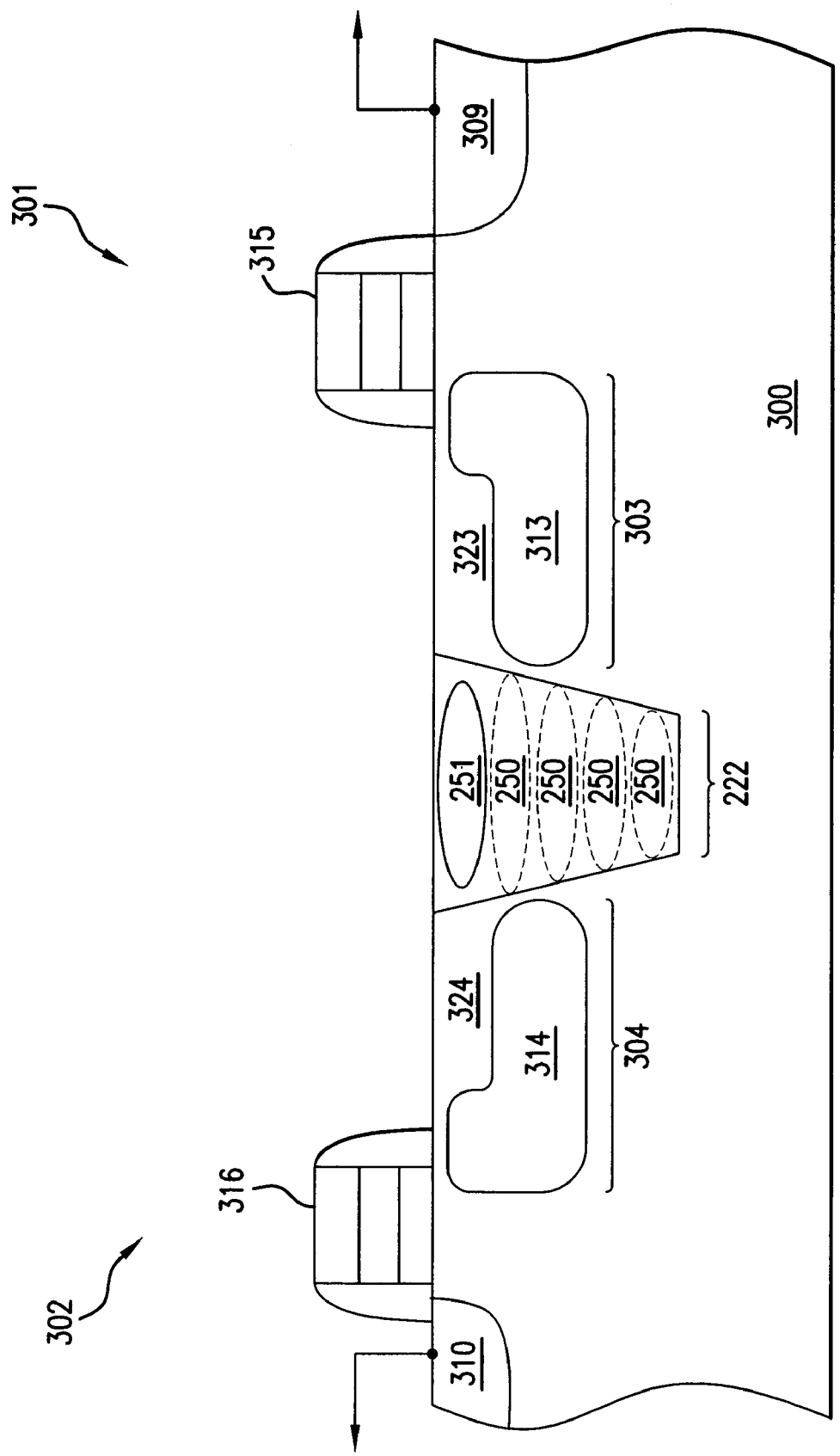
FIG. 3 is a cross-sectional view of a portion of two adjacent pixel cells, constructed in accordance with a first exemplary embodiment of the invention.

Now turning to the figures, where like numerals represent like elements, FIG. 3 depicts a cross-sectional view of two adjacent pixel cells 301, 302 having photosensors 303, 304 separated by an isolation region 222, constructed in accordance with the invention. Specifically, the isolation region 222 consists of at least one p-well ion implant 250 formed between two n-type charge accumulation regions 313, 314 in a p-type epitaxial layer 300 above a p+ substrate. The illustrated isolation region 222 begins at a top surface of the epitaxial layer 300 and ends at a depth in the epitaxial layer 300 that is deeper than that of the adjacent charge accumulation regions 313, 314.

In accordance with a preferred embodiment, the isolation region 222 is formed of several p-well ion implants 250 that effectively form a solid p-well isolation region 222. Each ion-implant region 250 is formed by implanting an appropriate ion, such as boron, into a pre-determined area of the p-type epitaxial layer 300. The doping concentration of the implants 250 may be in the range of approximately $1e^{11}$ to $1e^{15}$ atoms per $cm^3$. Photosensor 303 has a top p+ enhancement layer 323, and similarly photosensor 304 has a p+ enhancement layer 324, each located just below a top surface of the epitaxial layer 300. Similarly, the ion-implant isolation region 222 has a p+ enhancement layer 251 near the surface of the epitaxial layer 300. It should be understood that the p+ enhancement layers, although designated with different numerals 323, 324 and 251, may be formed as one or more blanket enhancement deposition layers. In addition, the p+ enhancement layer 251 may be a higher concentration of ions than the implant regions 250.

Figure 1:
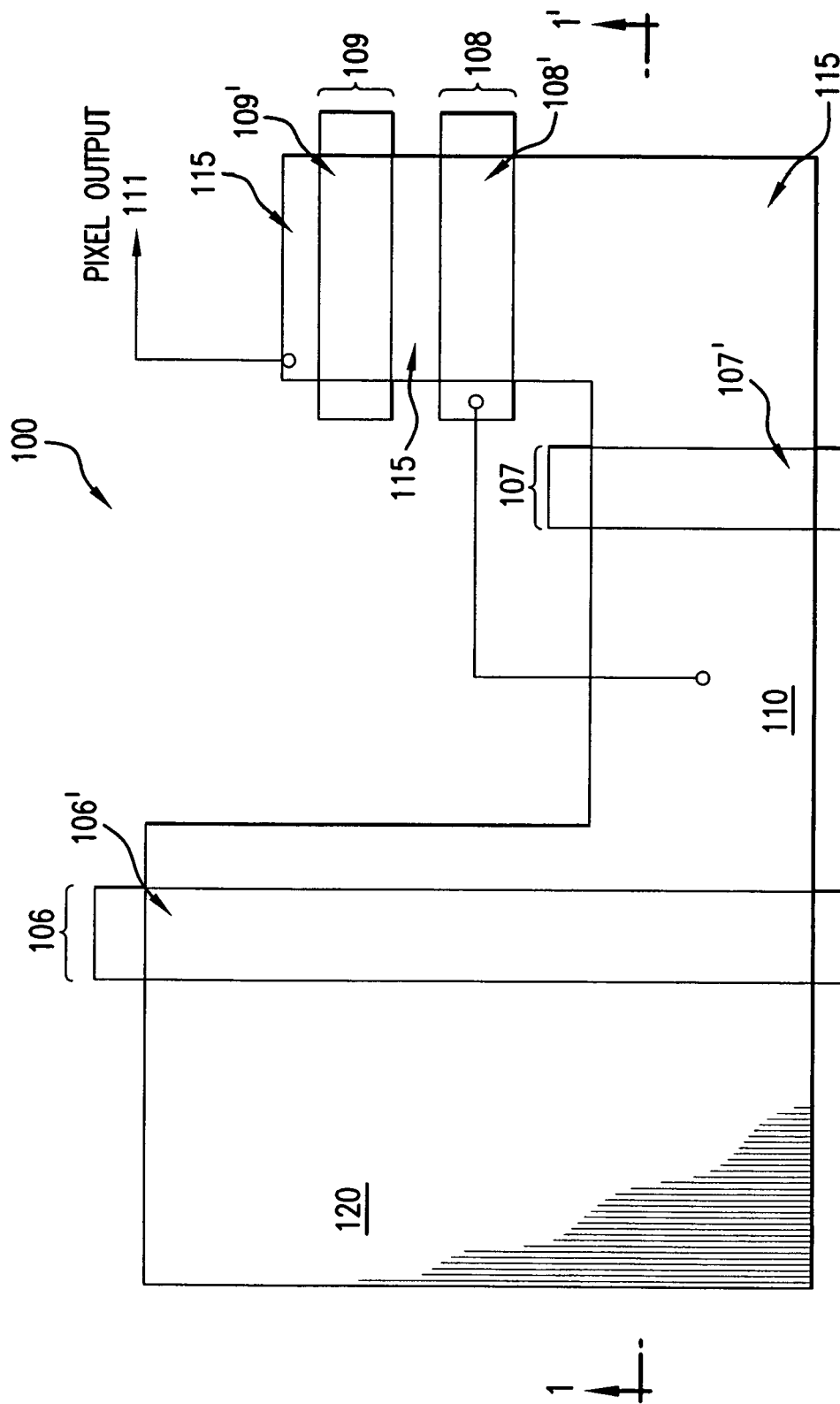
FIG. 1 is a top-down view of a conventional CMOS pixel cell.

Each pixel cell 301, 302 has a photosensor 303, 304 for generating photo-charges in response to incident light. The photosensors 303, 304 are illustratively a p–/n–/p+ photodiode, although it should be understood that the invention is not limited to a photodiode photosensor or to a photodiode having specific n or p-type concentrations. The photo-charges accumulate in the n-type accumulation regions 313, 314, and are transferred respectively by a transfer transistor 315, 316, to an associated floating diffusion region 309, 310. Other pixel circuitry (not shown) is connected to each floating diffusion region 309, 310 for generating and reading out a signal representing the amount of charge transferred to the floating diffusion regions 309, 310. This readout circuitry may include a source follower transistor and row select transistor, as described above with reference to FIG. 1 and other known four transistor (4T) pixel cell circuits described, for example, in the above-referenced patents.

Figure 2:
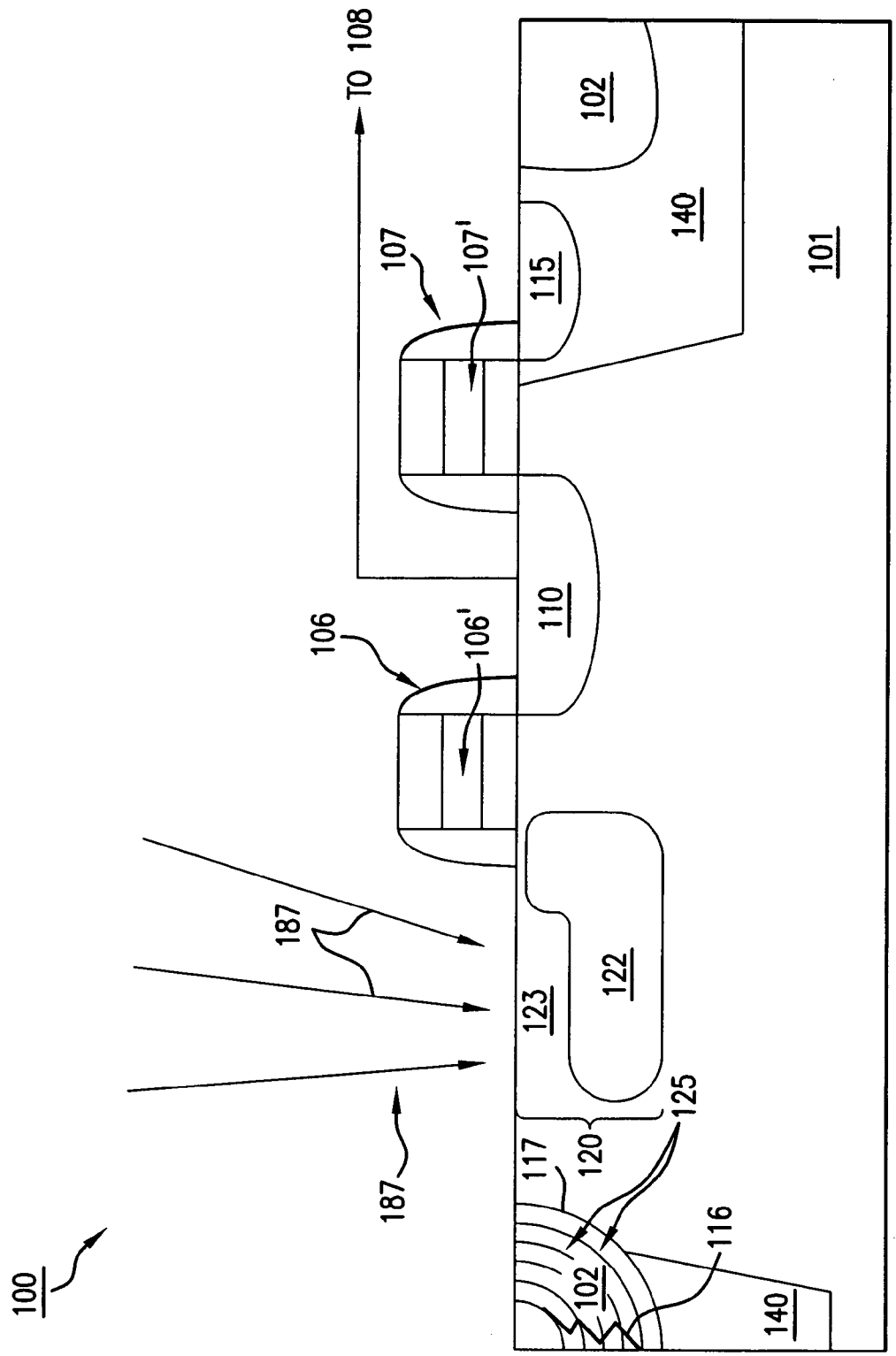
FIG. 2 is a cross-sectional view of the pixel cell of FIG. 1, taken along line 1-1'.

In accordance with this exemplary embodiment, the ion-implant isolation region 222 of the invention has several advantages over the conventional STI region 102 (FIG. 2) discussed above. First, the formation of the implanted isolation region 222 mitigates the stress and silicon dislocations associated with the STI trench in addition to reducing the cracks and/or voids that are associated with the deposition of oxide layers in an STI trench. In fact, the isolation region 222 can be formed deeper in the epitaxial layer 300 than a conventional STI region (102 in FIG. 2), thereby preventing unwanted charge flow beneath the isolation region 222.

Next, although conventional STI regions are often a site for electron generation/reaction, which leads to dark current, replacing the STI region with the ion-implant isolation region 222 eliminates this component of dark current from hot pixel defects. Because neither dark current nor electron generation is a major concern with the ion-implant isolation region 222, the active area (i.e., n-type accumulation region 313, 314) of each photosensor 303, 304 for adjacent cells 301, 302, can be located closer to one another and to the sidewall of the isolation region 222 than would be true if a conventional isolation trench was used. The spacing necessary between the isolation region 222 and each n-type accumulation region 313, 314 may therefore be cut in half, which advantageously increases the fill factor for pixel cells 301, 302, as more of a pixel's surface area can be photosensitive.

In addition, it should be understood that other isolation techniques, including but not limited to STI, can be used in conjunction with the present invention for providing isolation in other areas of the pixel arrays. For example, although the implant isolation region 222 is preferably used to isolate the neighboring photosensors 303, 304 from one another, other pixel components, like transistors, may be separated by other isolation techniques, including, but not limited to, STI or LOCOS regions.

Figure 4:
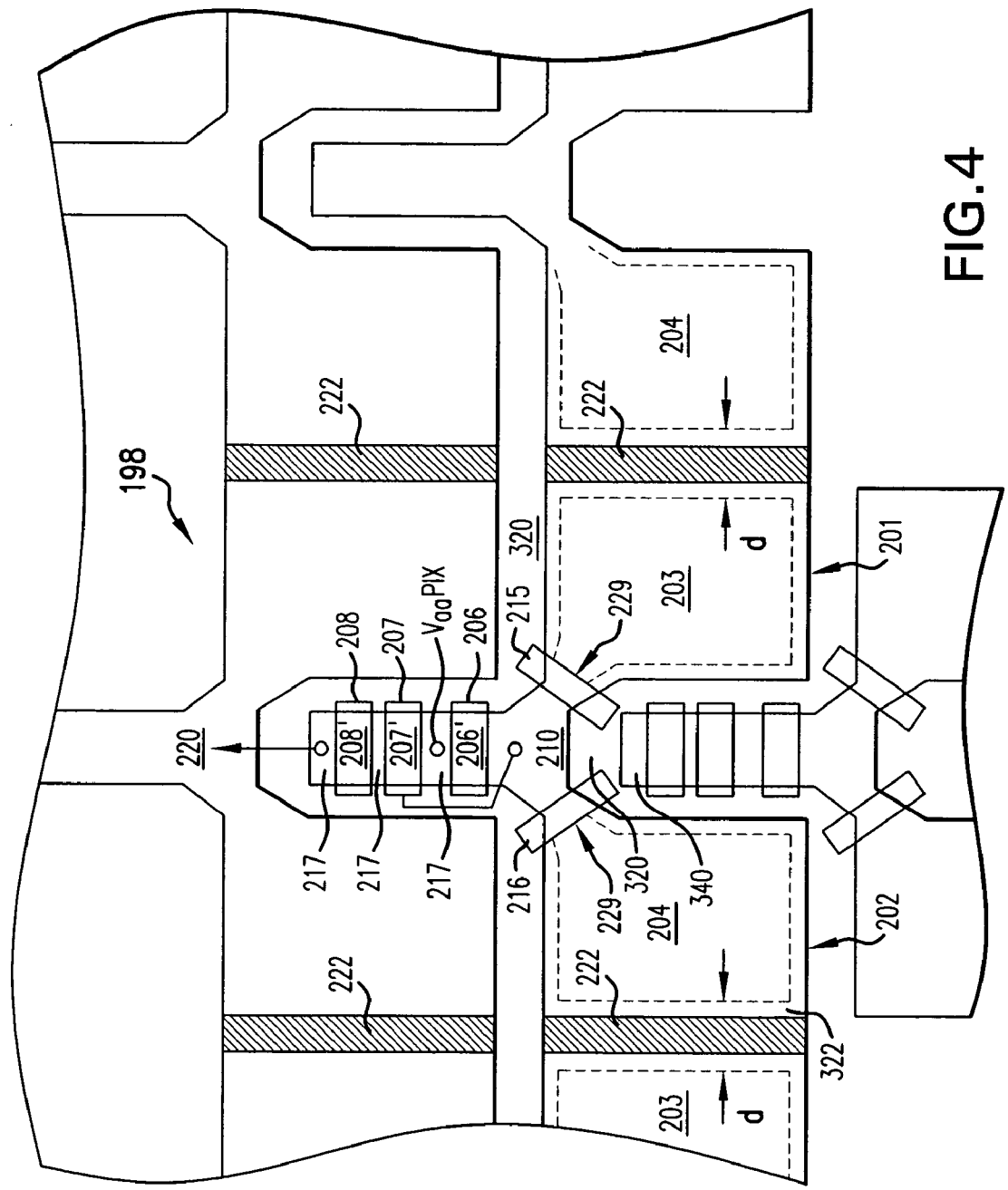
FIG. 4 is a top-down view of a portion of a pixel array constructed in accordance with a second exemplary embodiment of the invention.

FIG. 4 represents a top-down view of a portion of a pixel array 198 constructed in accordance with a second exemplary embodiment of the invention. As shown in FIG. 4, two neighboring pixel cells 201, 202 each have an associated photosensor 203, 204, respectively. The active areas of the photosensors 203, 204, which are depicted as dashed lines because they would not be visible in a top-down perspective of the cells, may comprise accumulation regions of a photodiode, for example. The photosensors 203, 204 are separated by an isolation region 320, which is preferably an STI isolation region.

Extending into the isolation region 320 is a trunk region 340 which is associated with a pixel pair in an adjacent row of the pixel array 198. The trunk region 340 may include active areas for transistors and a floating diffusion region for the pixels similar to those shared by the pixels 201, 202.

On either side of the photosensors 203, 204 opposite the isolation region 320 is an ion-implant isolation region 222 in accordance with the invention. The ion-implant isolation region 222 is used to isolate the photosensors 203, 204 from respective photosensor areas on adjacent pixels in the same column of the array 198. The ion-implant isolation region 222 may comprise a p-well region having a p+ enhancement layer on top of the p-well, when the active area of the photosensors 203, 204 are n-type accumulation regions. Thus, the implant isolation region 222 may be the same as the isolation region 222 discussed above with reference to FIG. 3.

In the FIG. 4 embodiment, each pixel cell 201, 202 has a transfer gate 215, 216 for a respective pair of transfer transistors; at least one edge 229 of the transfer gate is preferably angled with respect to the photosensors 203, 204 for improving the fill factor of pixel cells 211, 212. The transfer transistors, located at a corner of the photosensors 203, 204 transfer photo-charges generated by the photosensors 203, 204 through the transfer gates 215, 216 to a shared floating diffusion region 210, which serves as a common storage node for the pixels 201, 202. Other shared pixel components in this embodiment include a reset transistor 206 having a gate 206', which is located on a side of the floating diffusion region 210 opposite the photosensors 203, 204. A source/drain region 217 is located on a second side of the reset transistor gate 206' and is capable of receiving a supply voltage $V_{aa\text{-}pix}$. The floating diffusion region 210 is also electrically connected to the gate 207' of a source follower transistor 207, which has a drain coupled to $V_{aa\text{-}pix}$. The source follower transistor 207 creates a voltage output signal based on stored charge at the floating diffusion region 210. A row select transistor 208 having a gate 208' has a drain connected to the source of the source follower transistor 207, for selectively reading out the pixel signals to a column line 220.

Figure 5:
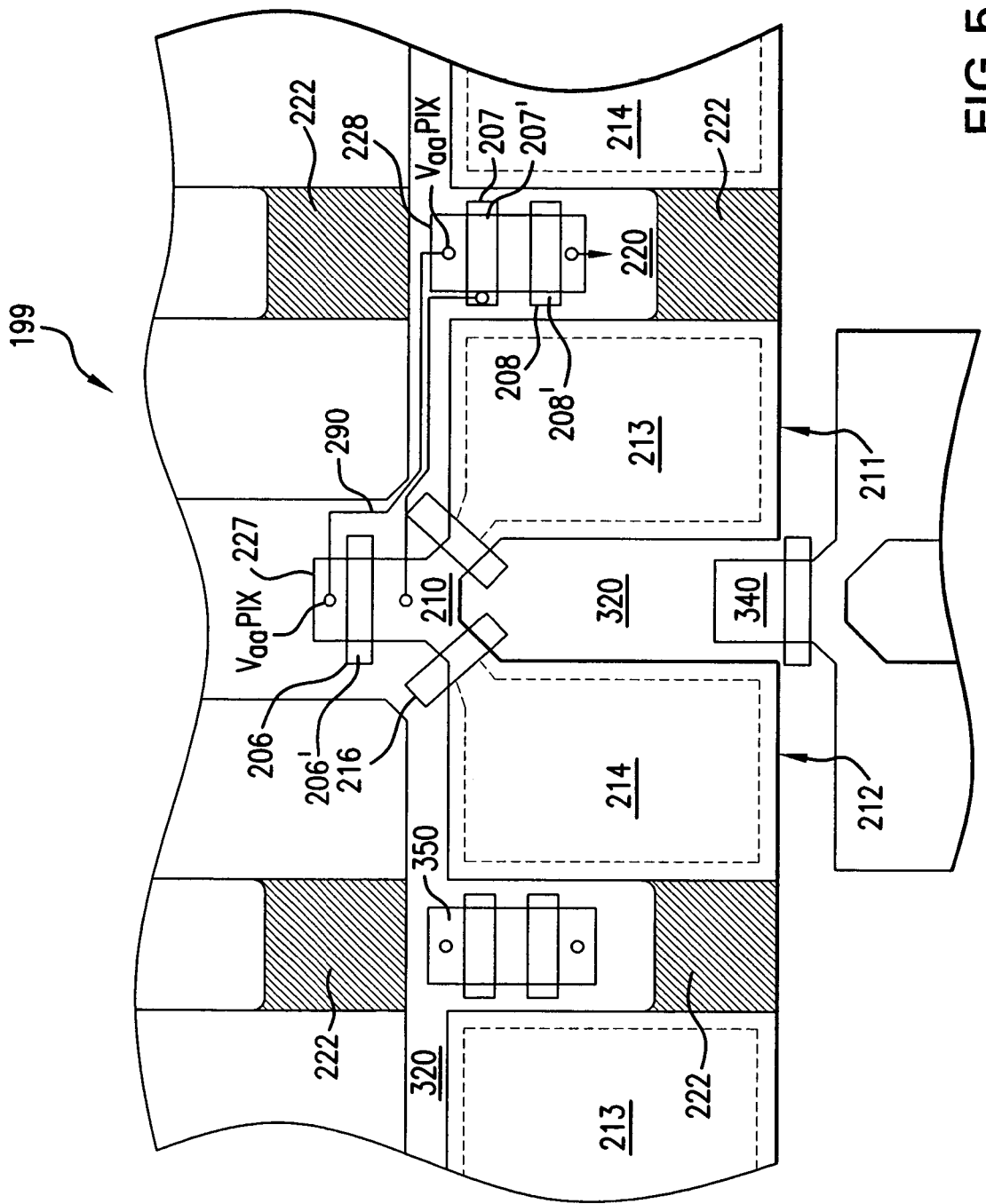
FIG. 5 is a top-down view of a portion of a pixel array constructed in accordance with a third exemplary embodiment of the invention.

A third exemplary embodiment of the invention is shown in top-down view in FIG. 5. It should be understood that while it is possible a cross-section of this third embodiment could be drawn as illustrated in FIG. 3, the third embodiment includes a unique layout of the remaining pixel components that are not shown in FIG. 3. The third exemplary embodiment includes two neighboring pixel cells 211, 212 having associated photosensors 213, 214, respectively. The photosensors 213, 214 are separated by an isolation region 320, which may be an STI region. As discussed above with respect to FIG. 4, a trunk region 340 for pixels in an adjacent row may extend into the isolation region 320.

Each pixel cell 211, 212 has an associated transfer gate 215, 216, respectively. In a preferred embodiment, the transfer gates 215, 216 are angled with respect to the associated photosensors 213, 214. The remaining pixel cell components are shared between the two pixel cells 211, 212. The FIG. 5 embodiment also shows the shared pixel components in a "split trunk" architecture, meaning that a first trunk that includes a first active region 227, where the transfer transistors, shared floating diffusion region 210 and reset transistor 206 are located, is physically separated from, but electrically connected to, a second trunk including a second active region 228. The second trunk includes gates for a source follower 207 and row select 208 transistors. The second trunk 228 can be located in an isolation region 320, located adjacent a photosensor 213 on pixel 211. A connector 290, that electrically connects the two trunks, may take the form of a buried interconnect near the surface of the substrate or a metallization wiring layer above the substrate.

It should be understood that other split trunk design layouts are also within the scope of this invention. For a more thorough discussion of "split trunk" pixel cell embodiments, see U.S. application Ser. No. 11/126,307, filed on May 11, 2005, also assigned to Micron Technology, Inc., the disclosure of which is hereby incorporated herein by reference in its entirety. The split trunk design provides increased array surface area for the photosensitive regions of pixel cells 211, 212, thereby improving the fill factor of the pixel array 199.

Figure 6:
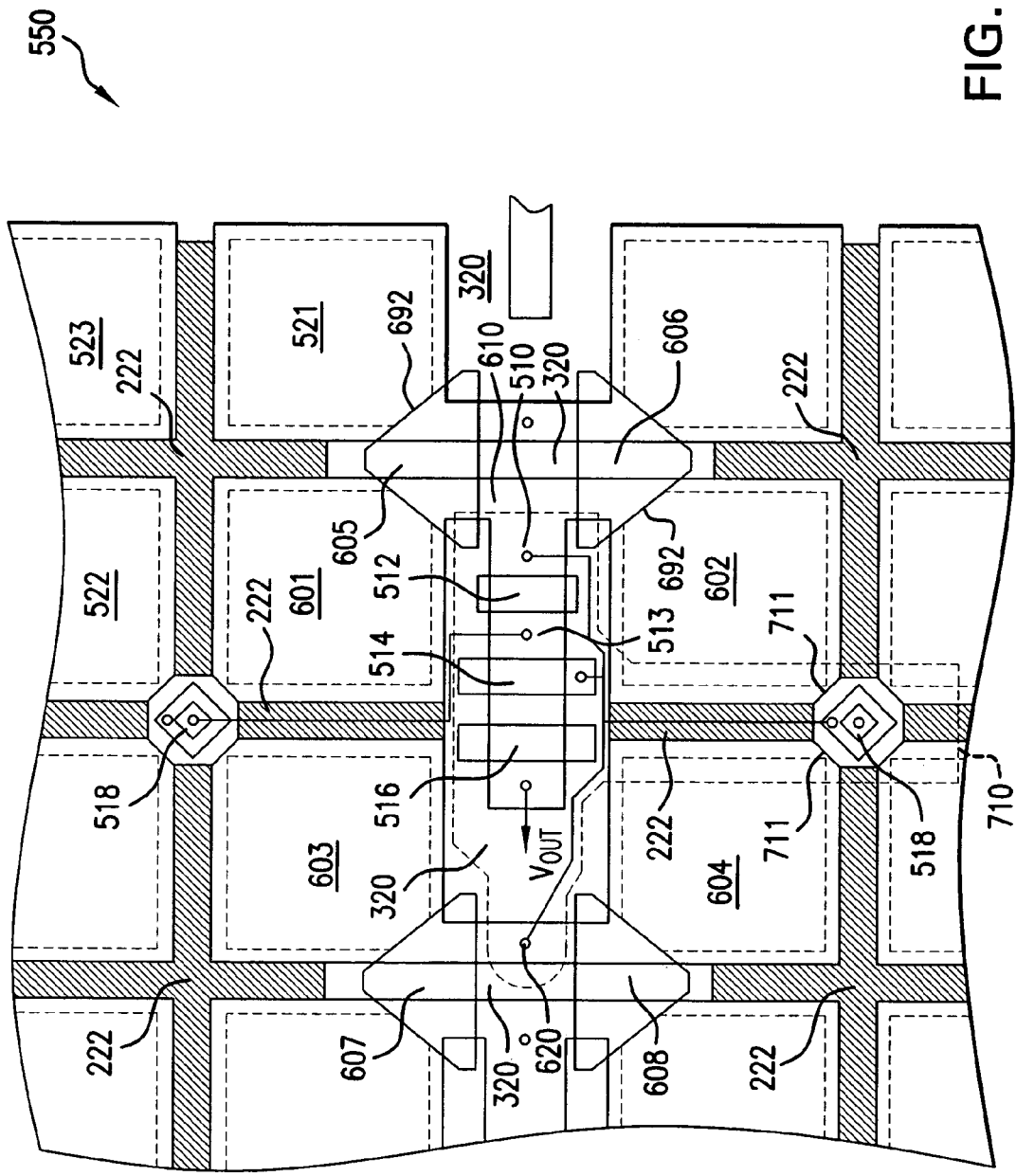
FIG. 6 is a top-down view of a portion of a pixel array constructed in accordance with a fourth exemplary embodiment of the invention.

Turning to FIG. 6, a fourth exemplary embodiment of the invention is now described. FIG. 6 shows a top-down view of a portion of the pixel array 550. The pixel array 550 architecture includes 4-way sharing of pixel components among individual pixel cells having respective photosensors 601, 602, 603, 604. These four pixels have a shared architecture shown by dotted lines area 710 in FIG. 6. The shared architecture includes a linearly-extending trunk located within the area between the pair of photosensors 601, 603 and the pair of photosensors 602, and 604. Isolation regions 222 in accordance with the invention are located between each two adjacent photosensors. For example, between photosensor pairs 601 and 521 and between 522 and 523. Other types of isolation regions 320 may also be used, for instance, to isolate the capacitors 518 or other parts of the circuitry. These isolation regions 320 may be STI or LOCOS regions.

Each pixel cell has an associated transfer transistor gate 605, 606, 607, 608 for transferring charges from the photosensors 601, 602, 603, 604. At least a portion, such as an edge 692, of each transfer gate 605, 606, 607, 608 is preferably at an angle 692 with respect to the photosensors 601, 602, 603, 604 as shown in FIG. 6. It should also be noted that the transfer transistor gates 605, 606, 607, 608 of this embodiment are being shared, each among two adjacent pixels in a column. For example, column adjacent pixel photosensors 601 and 521 each share the transfer gate 605. The two illustrated pixels (having associated photosensors 601, 521) that share a transfer transistor gate (605), however, do not share a floating diffusion region or readout circuit. Rather, this embodiment has two row adjacent pixels having photosensors 601 and 602 sharing a first floating diffusion region 610, and two row adjacent photosensors and 603, 604 sharing a second floating diffusion region 620.

The two floating diffusion regions 610, 620 are electrically connected to one another and to one electrode of an associated capacitor 518 and the source follower transistor 514 through a first metallization layer formed above the surface of the pixel array 550. As shown in FIG. 6, each capacitor 518 is connected at another side to a contact receiving a source voltage, e.g., $V_{aa-pix}$, at source/drain region 513 through a second metallization layer.

One reset transistor having a gate 512 is utilized for resetting the charges at both floating diffusion regions 610, 620 and the associated capacitor 518. To one side of the reset gate 512 is a source/drain region 513 that is capable of receiving a supply voltage $V_{aa-pix}$. The four pixel cells having associated photosensors 601, 602, 603, 604 share a common readout circuit that includes a source follower transistor having a gate 514 and a row select transistor having a gate 516. The four pixels also share the optional capacitor 518 which can increase the storage capacity of the two associated floating diffusion regions 510, 520.

The four-way shared pixel layout described herein illustratively has four pixels with respective photosensors 601, 602, 603, 604 sharing one set of readout circuitry 710. Photosensors 601 and 602 are adjacent within the same row. Photosensors 603 and 604 are adjacent within the same row directly above or below photosensors 601 and 602. Photosensors 601, 603 are column adjacent to photosensors 602, 604. Thus, a column output line $V_{out}$ is only necessary, in accordance with this exemplary embodiment, for every other column in the array.

The illustrated, 4-way shared pixel array configuration has at least two distinct advantages: it allows for larger pitch circuits in the periphery in the column direction and it reduces the metallization layers needed in the layers above the surface of the pixel array 550 while increasing the photosensitive area and thus quantum efficiency over the conventional pixel array. In addition, each capacitor 518 is efficiently located at the corners of four photosensors, such as shown at the clipped edges 711 of photosensors 602, 604. This location allows for a maximized capacitor area without sacrificing photosensitive area, or thereby decreasing the fill factor of the pixels array 550.

Figure 7:
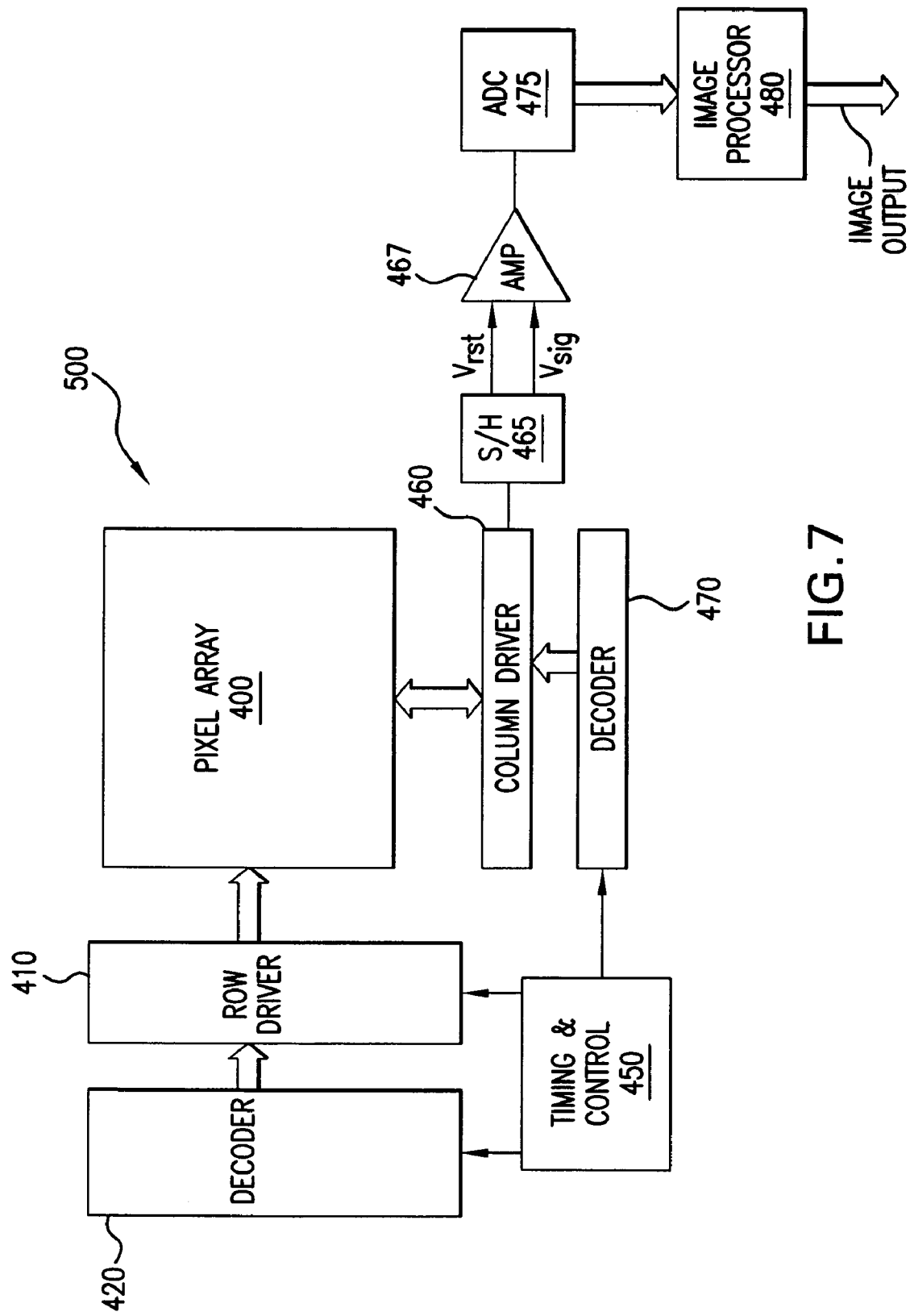
FIG. 7 is a block diagram of a CMOS imager chip having an array of pixel cells constructed in accordance with the invention.

FIG. 7 illustrates a block diagram of an exemplary CMOS imager 500 having a pixel array 400 with pixels constructed in accordance with the embodiments described above. Pixel array 400 comprises a plurality of pixels arranged in a predetermined number of columns and rows (not shown). Attached to the array 400 is signal processing circuitry, as described herein. The pixels of each row in array 400 are all turned on at the same time by a row select line, and the pixels of each column are selectively output by respective column select lines. A plurality of row and column lines are provided for the entire array 400. The row lines are selectively activated by a row driver 410 in response to row address decoder 420. The column select lines are selectively activated by a column driver 460 in response to column address decoder 470. Thus, a row and column address is provided for each pixel.

The CMOS imager 500 is operated by the timing and control circuit 450, which controls address decoders 420, 470 for selecting the appropriate row and column lines for pixel imaging and readout. The control circuit 450 also controls the row and column driver circuitry 410, 460 such that these apply driving voltages to the drive transistors of the selected row and column lines. The pixel column signals, which typically include a pixel reset signal ($V_{rst}$) and a pixel image signal ($V_{sig}$), are read by a sample and hold circuit 465 associated with the column driver 460. A differential signal ($V_{rst}-V_{sig}$) is produced by differential amplifier 467 for each pixel, which is digitized by analog-to-digital converter 475 (ADC).

The analog-to-digital converter 475 supplies the digitized pixel signals to an image processor 480, which forms and outputs a digital image.

Figure 8:
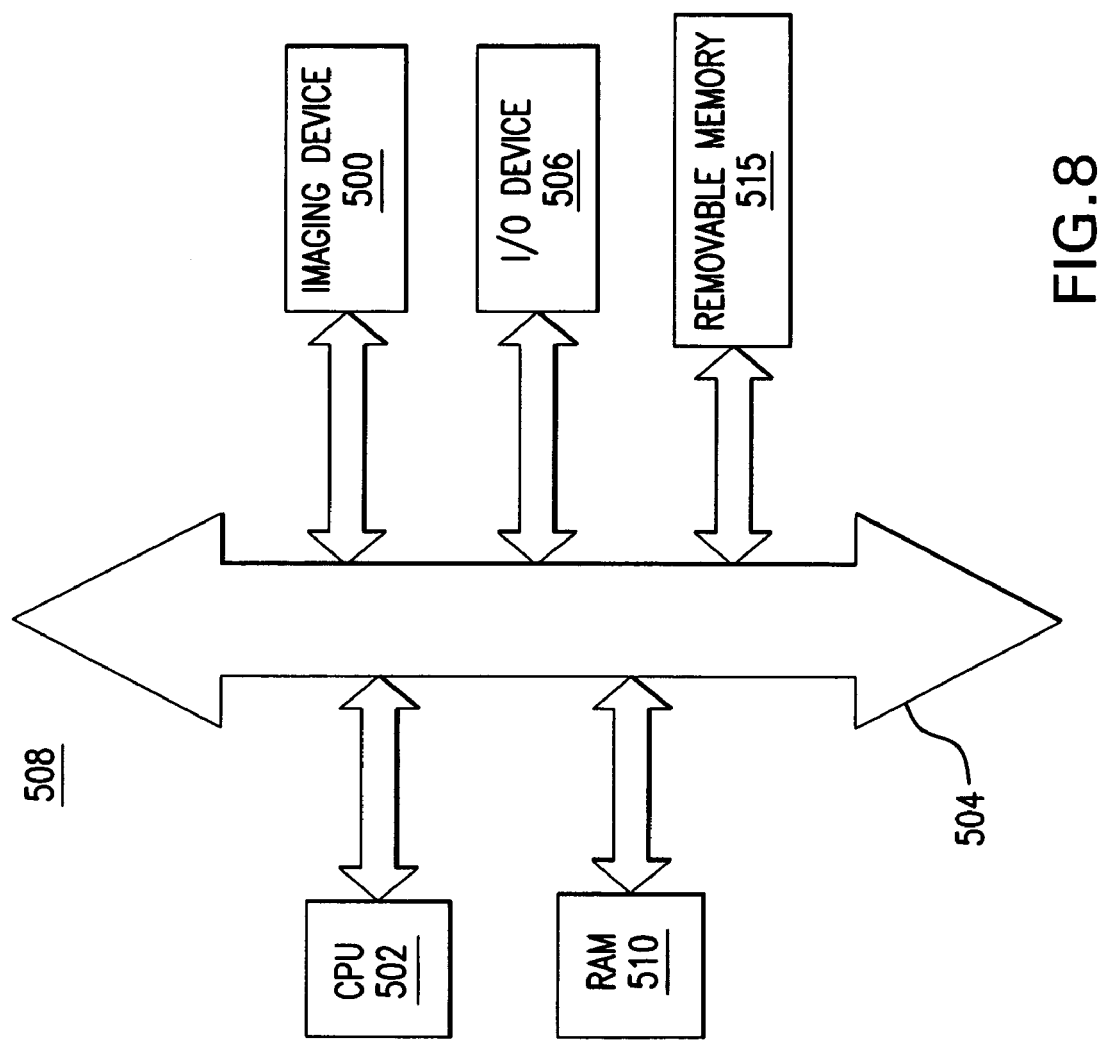
FIG. 8 is a schematic diagram of a processing system employing a CMOS imager constructed in accordance with the invention.

FIG. 8 shows a processor system 508, which includes an imaging device 500 constructed in accordance with an embodiment of the invention. The processor system 508 may be part of a digital camera, computer or other imaging or processing system. The imaging device 500 may receive control or other data from system 508. System 508 includes a processor 502 such as a central processing unit (CPU) for image processing, or other processing operations. The processor 502 communicates with various devices over a bus 504. Some of the devices connected to the bus 504 provide communication into and out of the system 508; an input/output (I/O) device 506 and imaging device 500 are such communication devices. Other devices connected to the bus 504 provide memory, for instance, a random access memory (RAM) 510 or a removable memory 515.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. For example, although the implant isolation region is shown only in context with CMOS pixel imager cells, it should be understood that the invention may have a broader scope of application, being useful as an isolation technique for isolating pixels or photosensors in any solid state imaging device. In addition, it should be understood that other isolation techniques may be useful in conjunction with the present invention, as mentioned above with respect to FIG. 3. Any other modifications, though presently unforeseeable, of the present invention that come within the spirit and scope of the following claims should be considered part of the present invention.

What is claimed as new and desired to be protected by Letters Patent of the United States is:

1. An isolation region for isolating two adjacent pixel cells, said region comprising:
   a material layer doped to a first conductivity type;
   a vertical stack of at least three implant regions doped to the first conductivity type, formed in the material layer and separating adjacent active devices of said adjacent pixel cells, and extending at least to a bottom of the active devices; and
   a doped surface layer formed over the vertical stack and extending to a top surface of the material layer for providing isolation between said adjacent active devices.

2. The isolation region of claim 1, wherein the material layer is a p-type epitaxial layer formed over a semiconductor substrate.

3. The isolation region of claim 2, wherein the at least three implant regions comprise a plurality of p-type implant regions.

4. The isolation region of claim 2, wherein the at least three implant regions form a p-well region.

5. The isolation region of claim 1, wherein the at least three implant regions are located between n-type charge accumulation regions of adjacent pixel cells.

6. The isolation region of claim 1, wherein the isolation region comprises at least four implant regions doped to the first conductivity type.

7. A pixel cell comprising: a photosensor formed in a material layer of a first conductivity type, the photosensor comprising:

an active charge accumulation area of a second conductivity type;

a first enhancement layer located over the active charge accumulation area and doped to the first conductivity type; and an isolation region located adjacent one side of the photosensor, the isolation region comprising: a plurality of implant regions doped to the first conductivity type and to substantially the same first concentration; and a second enhancement layer located just below the surface of the material layer in an area over the doped region, the second enhancement layer being doped to the first conductivity type and to a second concentration that is greater than the first concentration.

8. The pixel cell of claim 7, wherein the plurality of implant regions form a p-well region.

9. The pixel cell of claim 7, wherein the first and second enhancement layers are a p+ enhancement layers.

10. The pixel cell of claim 7, further comprising a transfer transistor having a gate that is located on a side of the charge accumulation region opposite the isolation region.

11. The pixel cell of claim 10, wherein the transfer transistor gate is at an angle with respect to the photosensor.

12. The pixel cell of claim 11, wherein the transfer gate is located at a corner of the photosensor.

13. The pixel cell of claim 10, wherein the transfer transistor is a part of a first active area of the pixel and wherein a second active area of the pixel, physically separated from the first active area, comprises at least one transistor for generating a signal from the pixel cell.

14. The pixel cell of claim 13, wherein the first and second active areas are electrically connected by a conductive interconnect.

15. The pixel cell of claim 14, wherein the conductive interconnect comprises a buried conductor.

16. The pixel cell of claim 14, wherein the conductive interconnect comprises a metallization layer.

17. A pixel cell array comprising:

a pair of adjacent pixel cells formed in a substrate; and at least four implant regions doped to a first conductivity type and arranged vertically in the substrate between at least portions of photosensors of adjacent pixel cells and extending at least to a bottom of the adjacent pixel cells, the at least four implant region extending into the substrate from a surface thereof and serving as an isolation region between portions of the photosensors of the adjacent pixel cells.

18. The pixel array of claim 17, wherein the at least four implant regions form a p-well region.

19. The pixel array of claim 17, wherein the at least four implant regions comprise at least one p-type ion-implant area doped to a first concentration and a p+ type enhancement layer located just below the surface and being doped to a second concentration greater than the first concentration.

20. The pixel array of claim 17, wherein the at least four implant regions are formed between two charge accumulation regions of the photosensors, the charge accumulation regions being doped a second conductivity type.

21. The pixel array of claim 17, each pixel cell further comprising:

a transfer transistor gate for transferring photo-charges to a storage node, wherein at least a portion of the transfer gate is at an angle with respect to the photosensor.

22. The pixel array of claim 21, wherein the two adjacent pixel cells share common pixel components for generating a signal from each pixel.

23. The pixel array of claim 22, wherein the common pixel components are arranged in a split trunk layout.

24. The pixel array of claim 17, wherein a shallow trench isolation region isolates other portions of the adjacent pixel cells.

25. A processing system comprising:

a processor; and an imaging device electrically coupled to said processor, said imaging device comprising a pixel array, said array comprising:

a plurality of pixel cells formed in a material layer of a first conductivity type and having a first dopant concentration, each pixel cell having a photosensor comprising a photo-charge accumulation region for generating photo-charges in response to light; and an isolation region comprising a vertical stack of at least three implant regions and a doped surface layer formed over the vertical stack, the isolation region being formed between the two charge accumulation regions of adjacent pixel cells, the isolation region extending from a top surface of the material layer to below the charge accumulation regions, and the isolation region being doped the first conductivity type to a concentration greater than the first dopant concentration.

26. The system of claim 25, wherein the isolation region comprises a plurality of p-type doped regions located between two n-type charge accumulation regions.

27. The system of claim 25, wherein a shallow trench isolation region is formed between the adjacent pixel cells to isolate areas other than the charge accumulation regions.

28. An imager comprising:

a plurality of pixel cells formed in a material layer of a first conductivity type and having a first dopant concentration, each pixel cell having a photosensor comprising a photo-charge accumulation region for generating photo-charges in response to light; and an isolation region comprising a vertical stack of at least three implant regions and a doped surface layer formed over the vertical stack, the isolation region being formed between the two charge accumulation regions of adjacent pixel cells, the isolation region extending from a top surface of the material layer to below the charge accumulation regions, and the isolation region being doped the first conductivity type to a concentration greater than the first dopant concentration.

29. The imager of claim 28, wherein the plurality of pixel cells are CMOS pixel cells.

30. An imager device comprising:

a pixel array comprising a plurality of pixel cells formed in a substrate and arranged in rows and columns, the array comprising: a first pair of adjacent pixel cells formed in a substrate;

at least four implant regions doped to a first conductivity type and formed vertically in the substrate between at least portions of photosensors of the adjacent pixel cells, the at least four implant regions extending into the substrate from a surface thereof to at least a bottom of said photosensors and serving as an isolation region between the at least portions of the photosensors of the adjacent pixel cells.

31. The imager device of claim 30, wherein the imager is a CMOS imager and the pixel cells are CMOS pixels.

32. The imager device of claim 30, further comprising:
a second pair of adjacent pixel cells,
wherein the isolation region is formed in an area between at least a portion of each of the first and the second pair of adjacent pixel cells.

33. The imager device of claim 32, wherein the first and the second pairs of pixel cells include column adjacent pixel cells.

34. The imager device of claim 30, wherein the isolation region comprises a doped region formed just beneath the surface of the substrate.

* * * * *